(12) United States Patent
Huang

(10) Patent No.: US 10,882,281 B2
(45) Date of Patent: Jan. 5, 2021

(54) DOUBLE-LAYER CONDUCTIVE LED PHOTOELECTRIC GLASS WITH VOLTAGE COMPENSATION AND MANUFACTURING PROCESS THEREOF

(71) Applicant: iMGS SMART GLASS TECHNOLOGIES (FUJIAN) CO., LTD, Longyan (CN)

(72) Inventor: Zhiming Huang, Longyan (CN)

(73) Assignee: IMGS SMART GLASS TECHNOLOGIES (FUJIAN) CO., LTD, Longyan (CN)

(*) Notice: Subject to any disclaimer, the term of this patent is extended or adjusted under 35 U.S.C. 154(b) by 68 days.

(21) Appl. No.: 16/348,503

(22) PCT Filed: Feb. 11, 2018

(86) PCT No.: PCT/CN2018/076230
§ 371 (c)(1),
(2) Date: May 9, 2019

(87) PCT Pub. No.: WO2018/177037
PCT Pub. Date: Oct. 4, 2018

(65) Prior Publication Data
US 2020/0376813 A1 Dec. 3, 2020

(30) Foreign Application Priority Data
Mar. 31, 2017 (CN) .......................... 2017 1 0205661

(51) Int. Cl.
*B32B 17/06* (2006.01)
*B32B 17/10* (2006.01)

(52) U.S. Cl.
CPC .. *B32B 17/10036* (2013.01); *B32B 17/10541* (2013.01); *B32B 17/10761* (2013.01); *B32B 17/10788* (2013.01)

(58) Field of Classification Search
CPC ........ B32B 17/10036; B32B 17/10541; B32B 17/10761; B32B 17/10788; H01L 33/48; H01L 33/62
(Continued)

(56) References Cited

U.S. PATENT DOCUMENTS

| 2011/0157110 A1 | 6/2011 | Chou et al. |
| 2013/0192672 A1* | 8/2013 | Ahn ..................... H01G 9/2081 136/256 |

(Continued)

FOREIGN PATENT DOCUMENTS

| CN | 201269492 Y | 7/2009 |
| CN | 101737652 A | 6/2010 |

(Continued)

*Primary Examiner* — Lauren R Colgan
(74) *Attorney, Agent, or Firm* — Bayramoglu Law Offices LLC

(57) ABSTRACT

A double-layer conductive LED photoelectric glass with voltage compensation and manufacturing process thereof are provided in the present invention. The photoelectric glass includes two layers of electrically conductive glasses. Inner sides of the electrically conductive cladded layers of the two layers of electrically conductive glasses are oppositely provided. The electrically conductive cladded layer of one of the two layers of electrically conductive glasses is provided with a plurality of etched circuits. The etched circuits are divided into two sets, which are respectively located on two sides of the electrically conductive glass. LEDs are provided on each of the etched circuits. The positive electrode connecting terminal and the negative electrode connecting terminal of the LED are respectively provided on two sides of each etched circuit. A heat-resistant transparent adhesive layer is provided in the middle of the two layers of electrically conductive glasses.

8 Claims, 4 Drawing Sheets

(58) Field of Classification Search
USPC .................................................. 428/426, 428
See application file for complete search history.

(56) References Cited

U.S. PATENT DOCUMENTS

2014/0226329 A1  8/2014  Oraw et al.
2015/0255438 A1  9/2015  Oraw et al.

FOREIGN PATENT DOCUMENTS

| CN | 104681595 A | 6/2015 |
| CN | 106848037 A | 6/2017 |
| CN | 206574745 U | 10/2017 |
| EP | 1788640 A1 | 5/2007 |

* cited by examiner

DOUBLE-LAYER CONDUCTIVE LED PHOTOELECTRIC GLASS WITH VOLTAGE COMPENSATION AND MANUFACTURING PROCESS THEREOF

CROSS REFERENCE TO THE RELATED APPLICATIONS

This application is the national phase entry of International Application No. PCT/CN2018/076230, filed on Feb. 11, 2018, which is based upon and claims priority to Chinese Patent Application No. 201710205661.1, filed on Mar. 31, 2017, the entire contents of which are incorporated herein by reference.

TECHNICAL FIELD

The present invention relates to the technical field of LED photoelectric glass, and particularly to a double-layer conductive LED photoelectric glass with voltage compensation and a manufacturing process thereof.

BACKGROUND

The LED photoelectric glass, also referred to as the electric luminous glass, or the electrically controlled luminous glass, was first invented in Germany, and successfully developed in China in 2006. The LED photoelectric glass has characteristics such as transparent, blast-proof, waterproof, ultraviolet-proof, and designable etc. The LED photoelectric glass itself is a safety glass, and also a building laminated glass, which has an energy-efficient, ultraviolet-proof and partially infrared-proof effect, and can be widely used in indoor and outdoor applications. Moreover, due to the energy-efficient characteristics of the LED, the LED photoelectric glass is extremely power-saving, so it is energy-saving and environmentally friendly. Therefore, the LED photoelectric glass is widely used in various fields at design and application ends, such as the commercial or residential indoor and outdoor decoration, the furniture design, the lamp illuminating design, the indoor landscape design, the indoor shower enclosure partition, the clinic, the house number, the emergency signage design, the conference room partition, the outdoor curtain wall glass, the shop show window, the franchised counter design, the luxury franchised counter design, the skylight design, the ceiling design, the sun room design, the glass panel for the computer, communication and consumer electronics product, the indoor and outdoor billboard design, the fashion home ornament, the product design of various end products such as clock, prizes, and lamps etc. and other fields.

SUMMARY

The existing LED photoelectric glass includes a conductive glass and a bonding layer. An electrically conductive layer is provided on the conductive glass. Two poles of an LED is formed on the electrically conductive layer by etching. A side edge of the conductive glass is connected to a flexible circuit board. Since there is a large distance between the flexible circuit board and the other end of an etched circuit (i.e. the middle of the photoelectric glass), the voltage is high on two sides and low on the middle in use, thereby causing nonuniform brightness on the LED photoelectric glass, namely, bright on two side dark on the middle. The voltage on the middle is low. Especially, when the photoelectric glass has a large size, the difference in brightness is larger.

The objective of the present invention is to provide a double-layer conductive LED photoelectric glass with voltage compensation and a manufacturing process thereof, so as to realize a uniform brightness on the entire photoelectric glass.

In order to achieve the above-mentioned objective, the technical solution of the present invention is as follows: a double-layer conductive LED photoelectric glass with voltage compensation, characterized in that, it includes two layers of electrically conductive glasses, wherein one side of each layer of electrically conductive glass is provided with an electrically conductive cladded layer; inner sides of the electrically conductive cladded layers of the two layers of electrically conductive glasses are oppositely configured; the electrically conductive cladded layer of one of the two layers of electrically conductive glasses is provided with a plurality of etched circuits; a depth of the etched circuits is greater than a depth of the electrically conductive cladded layers; the etched circuits are divided into two sets respectively located on two sides of the two layers of conductive glasses; LEDs are provided on each etched circuit; a positive electrode connecting terminal and a negative electrode connecting terminal of the LEDs are respectively provided on two sides of the etched circuit;

a heat-resistant transparent adhesive layer, wherein the heat-resistant transparent adhesive layer is provided between the two layers of electrically conductive glasses;

an electrically conductive element, wherein one end or one side of the electrically conductive element is connected to a middle portion unetched with circuits of the electrically conductive glass having the LEDs; and the other end or the other side of the electrically conductive element is connected to the electrically conductive cladded layer of the other layer of electrically conductive glass to realize an electrical connection of the two layers of electrically conductive glasses.

Preferably, the electrically conductive element bypasses a side of the transparent adhesive layer and is connected to the two layers of electrically conductive glasses, or the conductive element passes through the transparent adhesive layer to be connected to the two layers of electrically conductive glasses.

Preferably, the electrically conductive element is an elongated electrically conductive copper foil, an electrically conductive wire or an electrically conductive copper block.

Preferably, the transparent adhesive layer is Polyvinyl Butyral (PVB) adhesive, Polyvinyl Chloride (PVC) adhesive or Ethylene-vinyl Acetate (EVA) adhesive.

The present invention further includes a manufacturing process of the above mentioned double-layer conductive LED photoelectric glass with voltage compensation, characterized in that the manufacturing process includes the following steps:

S1: etching an electrically conductive cladded layer of a layer of electrically conductive glass by using a laser etching technique to form two desired sets of electrically conductive circuits;

S2: cleaning and drying the electrically conductive glass etched with the circuits in S1;

S3: arranging LEDs on the electrically conductive circuits, and arranging a positive electrode connecting terminal and a negative electrode connecting terminal of the LEDs on two sides of the electrically conductive circuit, respectively;

S4: connecting an electrically conductive element to a middle portion unetched with circuits of the electrically conductive glass having the LEDs; covering a heat-resistant adhesive sheet; connecting the other end of the electrically conductive element to the electrically conductive cladded layer of the other layer of electrically conductive glass; closely bonding the two layers of conductive glasses at two sides together by the heat-resistant adhesive sheet to complete a lamination; and forming an intermediate product;

S5: laminating the intermediate product obtained in S4 in a laminating machine; performing a high-temperature vacuum laminating process, a low-temperature laminating process, and a cold pressing process, wherein the heat-resistant adhesive sheet forms a transparent adhesive layer, and a photoelectric glass finished product is formed.

In an embodiment, the electrically conductive element in step S4 is an electrically conductive copper foil. One end of the electrically conductive copper foil is attached to a middle of the two sets of etched circuits of the electrically conductive glass with the LEDs, and the other end of the conductive copper foil is attached to a middle of the other electrically conductive glass.

In another embodiment, the electrically conductive element in step S4 is an electrically conductive wire. One end of the electrically conductive wire is attached to the middle of the two sets of etched circuits of the electrically conductive glass with the LEDs, and the other end of the conductive wire passes through the heat-resistant adhesive sheet and is attached to the electrically conductive cladded layer of the other layer of conductive glass.

In a third embodiment, the electrically conductive element in step S4 is an electrically conductive copper block. The electrically conductive copper block has a thickness equal to a thickness of the transparent adhesive layer. One side of the electrically conductive copper block is attached to the middle of the two sets of etched circuits of the electrically conductive glass with the LEDs, and the other side of the electrically conductive copper block is attached to the middle portion of the other layer of electrically conductive glass.

According to the above-mentioned technical solution, the present invention has the following advantages: since two layers of the electrically conductive glasses are oppositely configured, one of the two layers of electrically conductive glasses is provided with LEDs, and the other layer of electrically conductive glass is used as an electrically conductive connecting portion with voltage compensation, the voltage compensation is realized in a portion with a lower voltage in the middle of the two sets of etched circuits by the electrically conductive element, so as to make the LED lamps at different portions of the electrically conductive glass have a uniform overall brightness.

The reference numbers of the main elements are illustrated below: 1: electrically conductive glass, 11: electrically conductive cladded layer, 12: etched circuit, 13: LED, 2: transparent adhesive layer, 3: conductive copper foil, 4: electrically conductive wire, 5: electrically conductive copper block.

DETAILED DESCRIPTION OF THE EMBODIMENTS

In order to clarity the objective, technical solution, and advantages of the present invention, the present invention will be further described in detail below with reference to the drawings and preferred embodiments.

Embodiment 1

Figure 1:
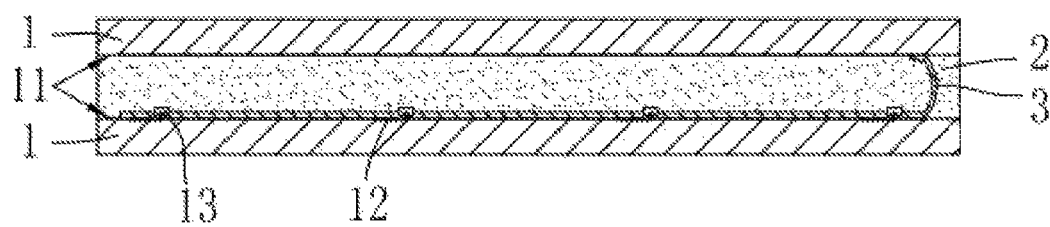
FIG. 1 is a cross-sectional view of Embodiment 1.

As shown in FIG. 1, Embodiment 1 discloses a double-layer electrically conductive LED photoelectric glass with voltage compensation, including two layers of electrically conductive glasses 1, a heat-resistant transparent adhesive layer 2 and an electrically conductive copper foil 3.

Figure 2:
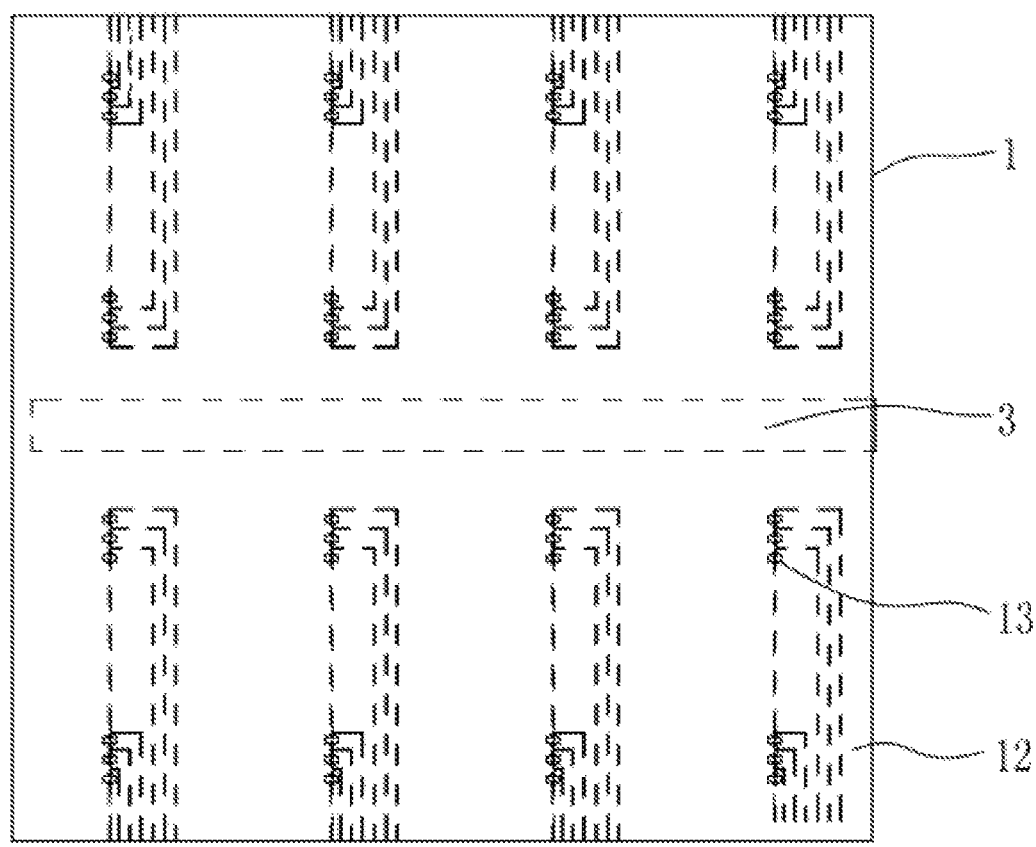
FIG. 2 is a top plan view of FIG. 1.
Figure 3:
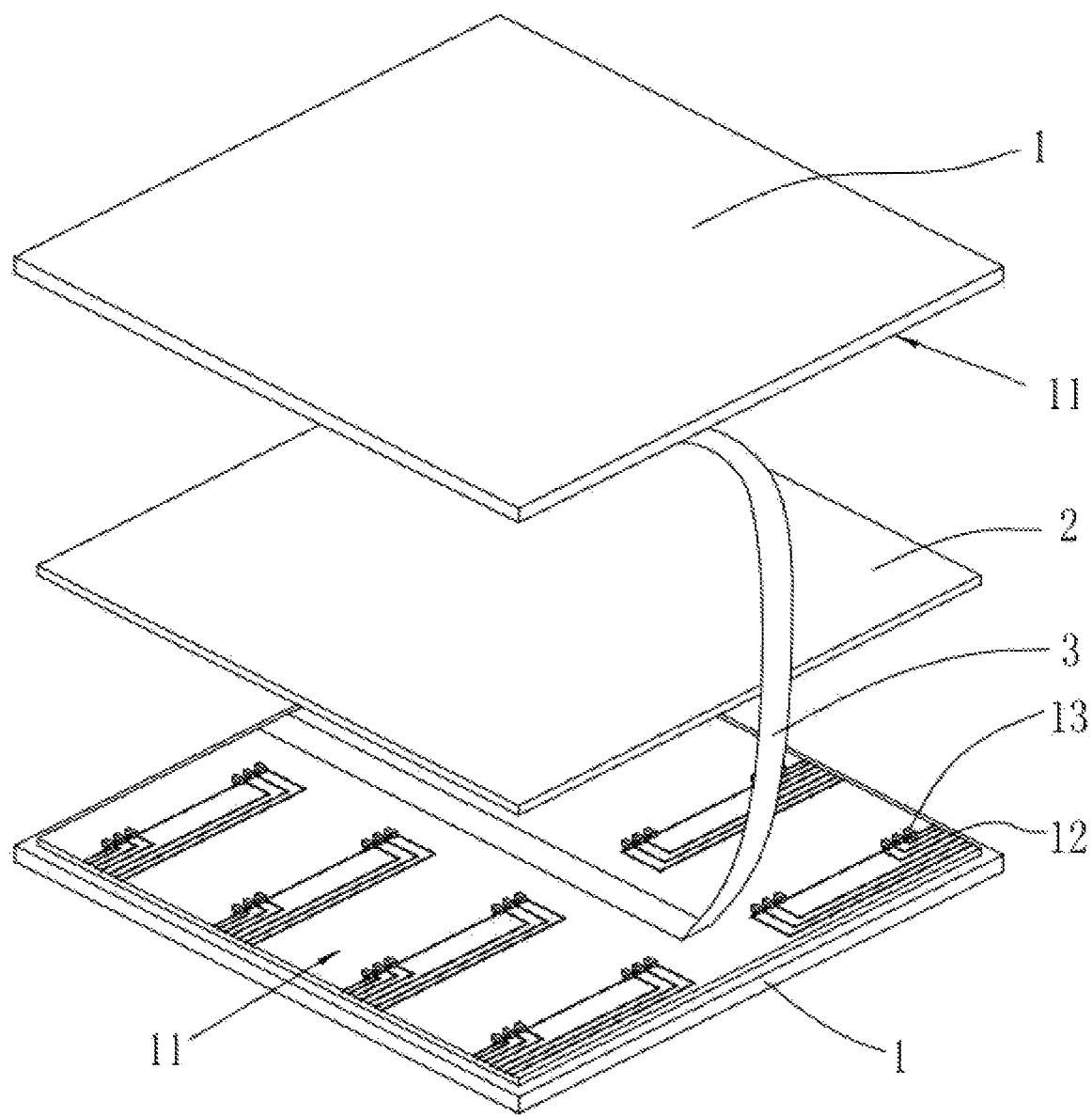
FIG. 3 is an exploded perspective view of Embodiment 1.

Combined with FIG. 2 and FIG. 3, one side of each layer of electrically conductive glass 1 is provided with an electrically conductive cladded layer 11, and inner sides of the electrically conductive cladded layers 11 of the two layers of electrically conductive glasses 1 are oppositely configured. The electrically conductive cladded layer 11 of one of the two layers of conductive glasses 1 is provided with a plurality of etched circuits 12. A depth of the etched circuits 12 is greater than a depth of the electrically conductive cladded layer 11. The etched circuits 12 are divided into two sets, and are respectively located on two sides of the electrically conductive glass 1. LEDs 13 are provided on each etched circuit 12. A positive electrode connecting terminal and a negative electrode connecting terminal of the LEDs 13 are respectively provided on two sides of the etched circuit 12. The transparent adhesive layer 2 is formed by curing PVB adhesive, PVC adhesive or EVA adhesive, and located in the middle of the two layers of conductive glass 1 for bonding purpose. One end of the electrically conductive copper foil 3 is connected to a middle portion unetched with circuits of the electrically conductive glass 1 with the LEDs. The other end of the electrically conductive copper foil 3 bypasses one side of the transparent adhesive layer 2, and is connected to the other layer of electrically conductive glass 1. In present invention, the electrically conductive circuits on the two sides of the electrically conductive glass 1 with the two sets of etched circuits 12 are connected to a flexible circuit board (FPC). One side of the other electrically conductive glass 1 is connected to the flexible circuit board. The flexible circuit boards are all connected to a controlling power supply. The controlling power supply is programmed to control the on-off of each LED. When the external power supply is turned on, the controlling power supply supplies power to the LED for illumination. The voltage of the electrically conductive glass 1 without the etched circuits is transmitted to the electrically conductive glass 1 with the etched circuit through the electrically conductive copper foil 3 for voltage compensation. The LEDs 13 form and display the desired words, patterns, colors, and brightness changes of the lamps.

The manufacturing process of the photoelectric glass of Embodiment 1 includes the following steps:

S1: etching the electrically conductive cladded layer 11 of the electrically conductive glass 1 by using a laser etching technique to form two desired sets of electrically conductive circuits;

S2: cleaning and drying the electrically conductive glass 1 etched with the electrically conductive circuits in S1;

S3: arranging the LEDs 13 on the electrically conductive circuit, and arranging the positive electrode connecting terminal and the negative electrode connecting terminal of the LEDs 13 on two sides of the electrically conductive circuits, respectively;

S4: attaching one end of an electrically conductive copper foil 3 to a middle portion of the two sets of etched circuits 12 of the electrically conductive glass 1 with LEDs 13; covering a heat-resistant adhesive sheet; attaching the other end of the electrically conductive copper foil 3 to a middle portion of the other electrically conductive glass 1; closely bonding the two layers of electrically conductive glasses on two sides together by the heat-resistant adhesive sheet to complete a lamination; and forming an intermediate product;

S5: laminating the intermediate product obtained in S4 in a laminating machine; performing a high-temperature vacuum laminating process, a low-temperature laminating process, and a cold pressing process, wherein the heat-resistant adhesive sheet forms a transparent adhesive layer, and a photoelectric glass finished product is formed.

The present invention also includes the following embodiments.

Embodiment 2

Figure 4:
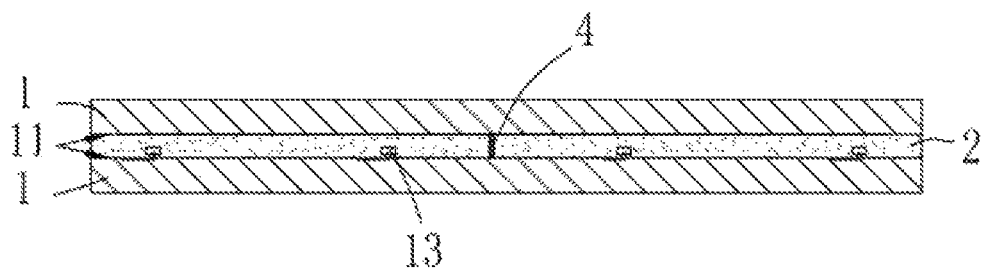
FIG. 4 is a cross-sectional view of Embodiment 2.

As shown in FIG. 4, Embodiment 2 discloses a double-layer conductive LED photoelectric glass with voltage compensation. The difference with Embodiment 1 is that the electrically conductive copper foil 3 is replaced with an electrically conductive wire 4.

Figure 5:
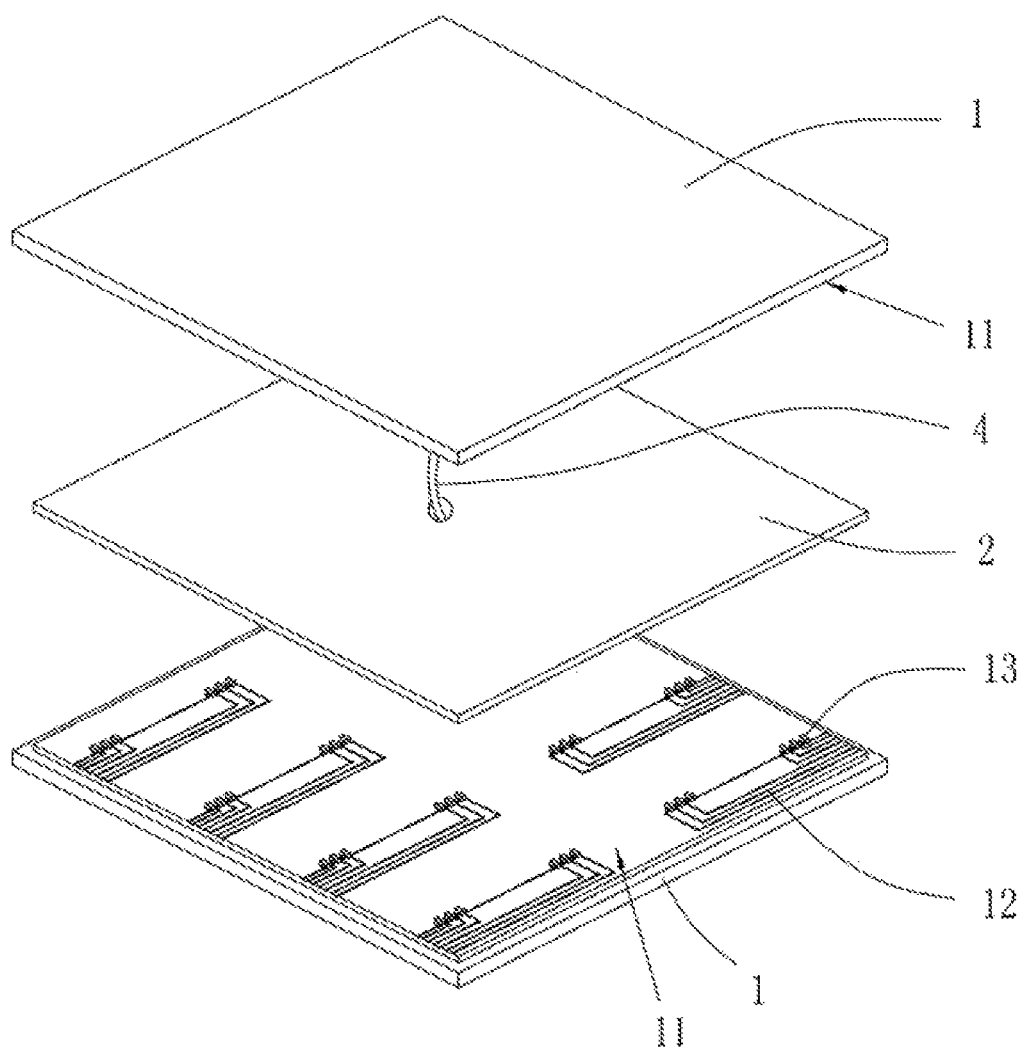
FIG. 5 is an exploded perspective view of Embodiment 2.

Combined with FIG. 5, the electrically conductive wire 4 is provided at the middle of the two layers of electrically conductive glasses 1. Two ends of the electrically conductive wire 4 respectively contact the two layers of electrically conductive glasses 1. In the present invention, the electrically conductive circuits on two sides of the electrically conductive glass 1 with the two sets of etched circuits 12 are connected to a flexible circuit board (FPC). One side of the other layer of conductive glass 1 is connected to the flexible circuit board. The flexible circuit boards are all connected to the controlling power supply. The controlling power supply is programmed to control the on-off of each LED. When the external power supply is turned on, the controlling power supply supplies power to the LEDs for illumination. The voltage of the electrically conductive glass 1 without the etched circuits is transmitted to the electrically conductive glass 1 with the etched circuits through the electrically conductive wire 4 for voltage compensation.

The manufacturing process of the photoelectric glass of Embodiment 2 includes the following steps:

S1: etching the electrically conductive layer of a layer of electrically conductive glass 1 by using a laser etching technique to form two desired sets of electrically conductive circuits;

S2: cleaning and drying the electrically conductive glass 1 etched with the electrically conductive circuits in S1;

S3: arranging the LEDs 13 on the electrically conductive circuits, and arranging the positive electrode connecting terminal and the negative electrode connecting terminal of the LEDs 13 on two sides of the electrically conductive circuit, respectively;

S4: attaching and fixing one end of an electrically conductive wire 4 to a middle of the two sets of etched circuits 12 of the electrically conductive glass 1 with LEDs 13; covering a heat-resistant adhesive sheet; drilling a hole on a middle portion of the heat-resistant adhesive sheet for the electrically conductive wire to pass through; covering the other layer of electrically conductive glass 1; closely bonding the two layers of electrically conductive glasses on two sides together by the heat-resistant adhesive sheet to complete a lamination; and forming an intermediate product;

S5: laminating the intermediate product obtained in S4 in a laminating machine; performing a high-temperature vacuum laminating process, a low-temperature laminating process, and a cold pressing process, wherein the heat-resistant adhesive sheet forms a transparent adhesive layer, and a photoelectric glass finished product is formed.

Embodiment 3

Figure 6:
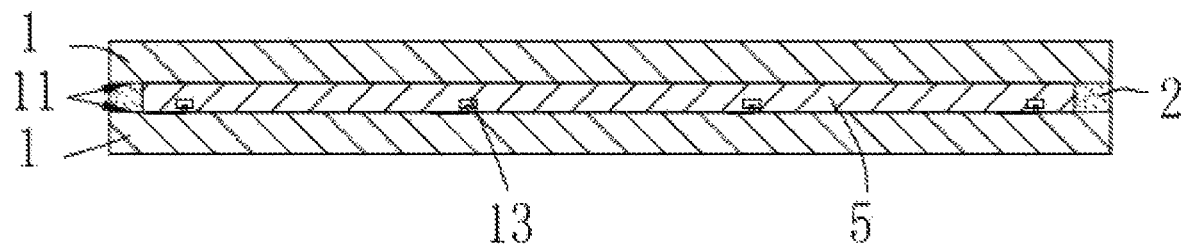
FIG. 6 is a cross-sectional view of Embodiment 3.

As shown in FIG. 6, the present embodiment discloses a double-layer conductive LED photoelectric glass with voltage compensation. The difference with Embodiment 1 is that the electrically conductive copper foil 3 is replaced with an electrically conductive copper block 5.

Figure 7:
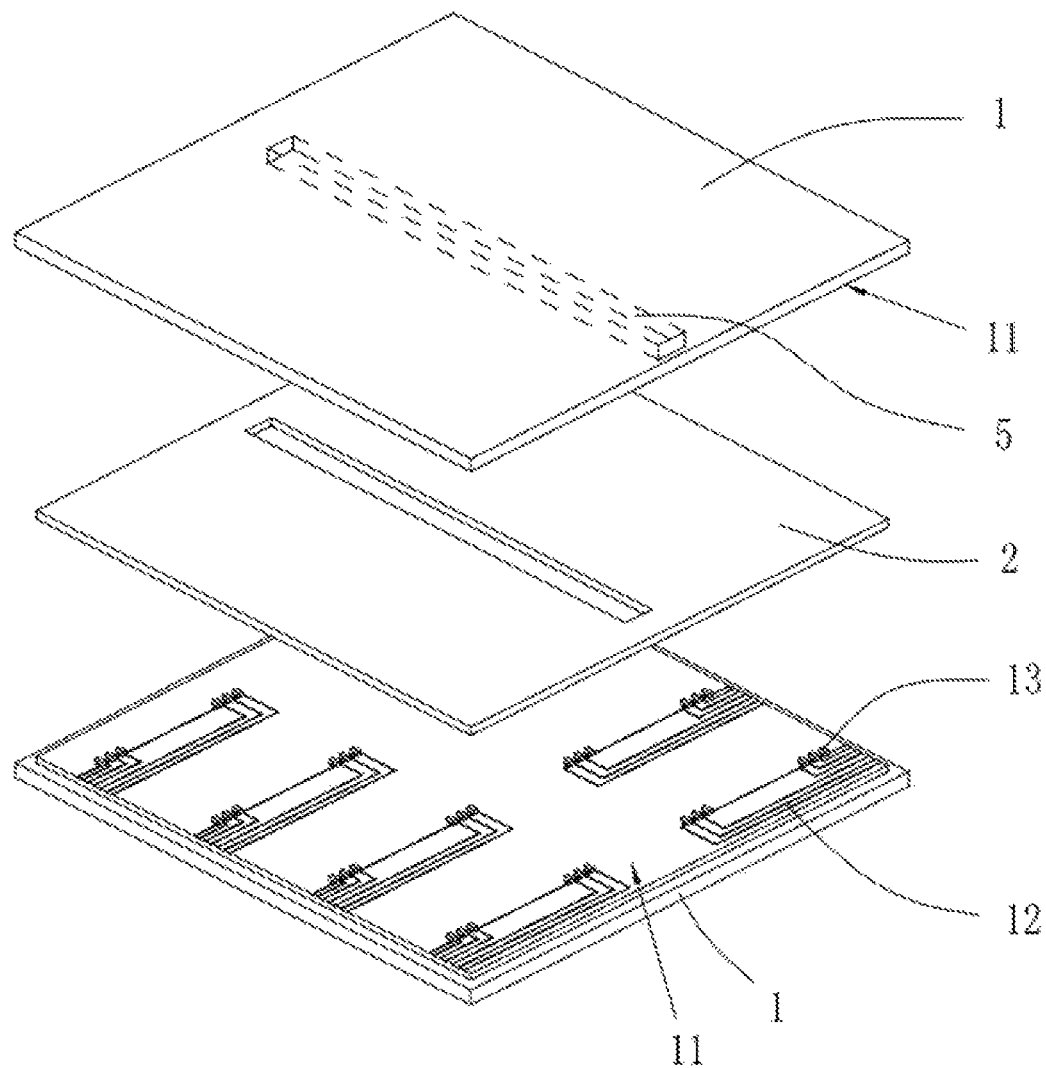
FIG. 7 is an exploded perspective view of Embodiment 3.

Combined with FIG. 7, the electrically conductive copper block 5 is provided at the middle of the two layers of electrically conductive glasses 1. Two sides of the electrically conductive copper block 5 contact the two layers of electrically conductive glasses, respectively. A thickness of the electrically conductive copper block 5 is equal to a thickness of the transparent adhesive layer 2. In the present invention, the electrically conductive circuits on two sides of the electrically conductive glass 1 with the two sets of etched circuits 12 are connected to a flexible circuit board (FPC). One side of the other layer of electrically conductive glass 1 is connected to the flexible circuit board. The flexible circuit board is connected to the controlling power supply. The controlling power supply is programmed to control the on-off of each LED. When the external power supply is turned on, the controlling power supply supplies power to the LEDs for illumination. The voltage of the electrically conductive glass 1 without the etched circuits is transmitted to the electrically conductive glass 1 with the etched circuits through electrically conductive copper block 5 for voltage compensation.

The manufacturing process of the photoelectric glass of Embodiment 4 includes the following steps:

S1: etching the electrically conductive layer of one layer of electrically conductive glass 1 by using a laser etching technique to form two desired sets of electrically conductive circuits;

S2: cleaning and drying the electrically conductive glass 1 etched with the electrically conductive circuits in S1;

S3: arranging the LEDs on the electrically conductive circuits, and arranging the positive electrode connecting terminal and the negative electrode connecting terminal of the LEDs 13 on two sides of the electrically conductive circuit, respectively.

S4: attaching one side of the electrically conductive copper block 5 to a middle of the two sets of etched circuits 12 of the electrically conductive glass 1 with LEDs 13; covering a heat-resistant adhesive sheet; arranging an accommodating space for the electrically conductive copper block to pass through on a middle portion of the heat-resistant adhesive sheet, or arranging two pieces of heat-resistant adhesive sheets on two sides of the electrically conductive copper block, respectively; covering the other layer of electrically conductive glass 1; closely bonding the two layers of conductive glasses on two sides together by the heat-resistant adhesive sheet to complete a lamination; and forming an intermediate product.

S5: laminating the intermediate product obtained in S4 in a laminating machine; performing a high-temperature vacuum laminating process, a low-temperature laminating process, and a cold pressing process, wherein the heat-resistant adhesive sheet forms a transparent adhesive layer, and a photoelectric glass finished product is formed.

In summary, in the present invention, the electrically conductive elements (the electrically conductive copper foil, the electrically conductive wire, the electrically conductive copper block) is configured to electrically connect two sets of conductive glasses. The voltage compensation is realized in portions with a lower voltage in the middle of the two sets of etched circuits. The present invention is easy to use.

The preferred embodiment of the present invention is described above. Any modification or alternative that can be easily obtained by the person skilled in the art within the technical scope of the present invention should be considered as falling within the scope of the present invention.

What is claimed is:

1. A double-layer conductive LED photoelectric glass with voltage compensation, comprising
   a first electrically conductive glass and a second electrically conductive glass, wherein one side of each of the first electrically conductive glass and the second electrically conductive glass is provided with an electrically conductive cladded layer; inner sides of the electrically conductive cladded layers of the first electrically conductive glass and the second electrically conductive glass are oppositely configured; the electrically conductive cladded layer of the first electrically conductive glass is provided with a plurality of etched circuits; a depth of each etched circuit is greater than a depth of the electrically conductive cladded layer; the plurality of etched circuits are divided into two sets respectively located on two sides of the first electrically conductive glass; LEDs are provided on each etched circuit; a positive electrode connecting terminal and a negative electrode connecting terminal of the LEDs are respectively provided on two sides of the etched circuits;
   a heat-resistant transparent adhesive layer, wherein the heat-resistant transparent adhesive layer is provided between the first electrically conductive glass and the second electrically conductive glass;
   an electrically conductive element, wherein a first end or a first side of the first electrically conductive element is connected to a middle portion unetched with circuits of the first electrically conductive glass provided with the LEDs; and a second end or a second side of the electrically conductive element is connected to the electrically conductive cladded layer of the second electrically conductive glass to realize an electrical connection of the first electrically conductive glass and the second electrically conductive glass.

2. The double-layer conductive LED photoelectric glass with the voltage compensation according to claim 1, wherein the electrically conductive element bypasses a side of the heat-resistant transparent adhesive layer to be connected to the first electrically conductive glass and the second electrically conductive glass, or the electrically conductive element passes through the heat-resistant transparent adhesive layer to be connected to the first electrically conductive glass and the second electrically conductive glass.

3. The double-layer conductive LED photoelectric glass with the voltage compensation according to claim 1, wherein the electrically conductive element is an electrically conductive copper foil, an electrically conductive wire, or an electrically conductive copper block.

4. The double-layer conductive LED photoelectric glass with the voltage compensation according to claim 1, wherein the heat-resistant transparent adhesive layer is selected from the group of Polyvinyl Butyral (PVB) adhesive, Polyvinyl Chloride (PVC) adhesive, and Ethylene-vinyl Acetate (EVA) adhesive.

5. A manufacturing process of a double-layer conductive LED photoelectric glass with voltage compensation, comprising:
   S1: etching an electrically conductive cladded layer of a first electrically conductive glass by using a laser etching technique to form two sets of electrically conductive circuits;
   S2: cleaning and drying the first electrically conductive glass etched with the electrically conductive circuits in S1;
   S3: arranging LEDs on the electrically conductive circuit, and arranging a positive electrode connecting terminal and a negative electrode connecting terminal of the LEDs on two sides of the electrically conductive circuit, respectively;
   S4: connecting a first end of an electrically conductive element to a middle portion unetched with the electrically conductive circuits of the first electrically conductive glass provided with the LEDs; covering a heat-resistant adhesive sheet; connecting a second end of the electrically conductive element to an electrically conductive cladded layer of a second electrically conductive glass; closely bonding the first electrically conductive glass and the second electrically conductive glass on two sides of the electrically conductive element together by the heat-resistant adhesive sheet to complete a lamination; and forming an intermediate product;
   S5: laminating the intermediate product obtained in S4 in a laminating machine; performing a high-temperature vacuum laminating process, a low-temperature laminating process, and a cold pressing process, wherein the heat-resistant adhesive sheet forms a heat-resistant transparent adhesive layer, and the double-layer conductive LED photoelectric glass is formed.

6. The manufacturing process of the double-layer conductive LED photoelectric glass with the voltage compensation according to claim 5, wherein the electrically conductive element in step S4 is an electrically conductive copper foil; a first end of the electrically conductive copper foil is attached to a middle of the two sets of the electrically conductive circuits of the first electrically conductive glass with the LEDs, and a second end of the electrically conductive copper foil is attached to a middle of the second electrically conductive glass.

7. The manufacturing process of the double-layer conductive LED photoelectric glass with the voltage compensation according to claim 5, wherein the electrically conductive element in step S4 is an electrically conductive wire; a first end of the electrically conductive wire is attached to a middle of the two sets of the electrically conductive circuits of the first electrically conductive glass with the LEDs, and a second end of the electrically conductive wire passes through the heat-resistant adhesive sheet to be attached to the electrically conductive cladded layer of the second electrically conductive glass.

8. The manufacturing process of the double-layer conductive LED photoelectric glass with the voltage compensation according to claim 5, wherein the electrically conductive element in step S4 is an electrically conductive copper block; the electrically conductive copper block has a thickness equal to a thickness of the transparent adhesive layer; a first side of the electrically conductive copper block is attached to a middle of the two sets of the electrically conductive circuits of the first electrically conductive glass with the LEDs, and a second side of the electrically conductive copper block passes through the heat-resistance adhesive sheet to be attached to a middle portion of the second electrically conductive glass.

* * * * *